United States Patent
Mayes et al.

(10) Patent No.: US 7,713,404 B2
(45) Date of Patent: May 11, 2010

(54) MONITORING APPARATUS AND METHOD FOR IMPROVING THE ACCURACY AND REPEATABILITY OF ELECTROCHEMICAL CAPACITANCE VOLTAGE (ECV) MEASUREMENTS

(75) Inventors: Ian Mayes, Bedfordshire (GB); Michael Sweeney, Hemel Hempstead (GB); Harvey Podgorney, Bedfordshire (GB); Clive Meaton, Monmouthshire (GB)

(73) Assignee: Nanometrics Incorporated, Milpitas, CA (US)

( * ) Notice: Subject to any disclaimer, the term of this patent is extended or adjusted under 35 U.S.C. 154(b) by 1071 days.

(21) Appl. No.: 10/520,439

(22) PCT Filed: Jul. 4, 2003

(86) PCT No.: PCT/GB03/02875
§ 371 (c)(1),
(2), (4) Date: Apr. 5, 2006

(87) PCT Pub. No.: WO2004/006419
PCT Pub. Date: Jan. 15, 2004

(65) Prior Publication Data
US 2006/0207887 A1   Sep. 21, 2006

(30) Foreign Application Priority Data
Jul. 6, 2002  (GB) ................................ 0215736.0

(51) Int. Cl.
*G01N 27/26* (2006.01)
(52) U.S. Cl. .................................... 205/775; 205/793.5

(58) Field of Classification Search ................. 205/775, 205/793.5
See application file for complete search history.

(56) References Cited

U.S. PATENT DOCUMENTS

| 3,803,489 A | 4/1974 | Miller |
| 4,028,207 A | 6/1977 | Faktor et al. |
| 4,125,440 A | 11/1978 | Markovits |
| 4,168,212 A | 9/1979 | Faktor et al. |
| 5,300,200 A | 4/1994 | Horanyi |

FOREIGN PATENT DOCUMENTS
WO    WO-2004/006419    1/2004

OTHER PUBLICATIONS

Gopal et al. "Electrochemical Capacitance Voltage Profiling of the Narrow Band Gap Semiconductor InAs," Journal of Electronic Materials, vol. 29, No. 11, 2000.*

Mayes, I., "Accuracy and Reproducibility of the Electrochemical Profiler," Mat Sci & Eng B80, 2001, pp. 160-163, Elsevier Science.

(Continued)

*Primary Examiner*—Alex Noguerola
(74) *Attorney, Agent, or Firm*—Silicon Valley Patent Group LLP (57) ABSTRACT

An apparatus and method for improving the accuracy of Electrochemical Capacitance Voltage (ECV) profiling measurements by alerting the operator to the presence of surface films or gas bubbles during the etching process and by using this in-situ monitoring apparatus to determine the true measurement area at the end of the measurement cycle and using the new value to recalculate the data. By making the area measurement integral to the ECV tool, every sample measurement can be corrected for the true measurement area, leading to improved accuracy and eliminating a large source of error.

7 Claims, 5 Drawing Sheets

OTHER PUBLICATIONS

English translation of Office Action dated Mar. 18, 2009, cited in copending Japanese Patent Application No. 2004-518955, filed Jul. 4, 2003, in the name of Nanometrics Incorporated, 2 pgs.

International Search Report mailed on Mar. 30, 2004 for PCT Application No. PCT/GB2003/002875 filed on July 4, 2003, four pages.

* cited by examiner

MONITORING APPARATUS AND METHOD FOR IMPROVING THE ACCURACY AND REPEATABILITY OF ELECTROCHEMICAL CAPACITANCE VOLTAGE (ECV) MEASUREMENTS

CROSS-REFERENCE TO RELATED APPLICATIONS

This is a U.S. National Stage application of PCT/GB2003/002875, filed 4 Jul. 2003, the entirety of which is incorporated herein by reference. This application also claims the benefit of British patent application no. 0215736.0, filed 6 Jul. 2002.

BACKGROUND

The invention relates to an apparatus and method for improving the accuracy of Electrochemical Capacitance Voltage (ECV) profiling measurements by alerting the operator to the presence of surface films or gas bubbles during the etching process and by determining the true measurement area at the end of the measurement cycle and using the new value to recalculate the carrier concentration data. By making the area measurement integral to the ECV tool, every sample measurement can be corrected for the true measurement area, leading to improved accuracy and eliminating a large source of error. Further reduction in error is achieved by using the integral measurement system to monitor the sample surface during measurement for surface films and gas bubbles.

Semiconductor devices are made by sandwiching layers of material of different electrical and/or optical properties together. The layers are formed by epitaxial growth on or ion implantation or diffusion into a substrate wafer. Correct device operation necessitates close control of layer properties including carrier concentration and thickness. U.S. Pat. Nos. 4,028,207 & 4,168,212 describe the ECV profiling method, which is used for determining the carrier concentration as a function of depth into the layer and is therefore ideally suited to measuring these parameters.

ECV profiling makes use of the diode structure formed when a conducting liquid (electrolyte) is placed in contact with a semiconductor. The capacitance of the junction, in the reverse bias region, is determined by the magnitude of the applied bias and the carrier concentration vs. depth profile. By measuring this capacitance as a function of bias the carrier concentration depth profile can be determined. In this mode of operation the ECV profiler is similar to tools, which use metallisation or mercury in place of an electrolyte to form a diode structure. However, such tools are usually restricted to shallow depth profiles due to reverse bias breakdown of the semiconductor-metal junction. By using an electrolyte this limitation is overcome. The electrolyte is used to electrochemically etch into the sample, increasing the depth profiled without increasing the measurement bias. This makes ECV profiling a very powerful method for characterizing multi-layer structures.

Some of the factors which affect the accuracy and reproducibility of ECV profiling have been mentioned in "I. Mayes—Accuracy and Reproducibility of the Electrochemical Profiler, Mat Sci & Eng B80 (2001) 160-163". This paper concludes that with 'best practice' the reproducibility of the method can be reduced to a standard deviation of around 2%. However, without careful control of the measurement a standard deviation of around 8% is more typical.

Usually a plastic ring, referred to as a sealing ring, defines the area of contact between the electrolyte and the semiconductor sample. Wear and distortion of this ring have a significant effect on the reproducibility of the contact area. In addition the contact pressure and wetting characteristics of the electrolyte have to be considered. All these factors influence the accuracy of the measurement.

Accurate measurements depend on knowing the precise area of contact between the test sample and the electrolyte and ensuring that it remains stable throughout the measurement process. As the carrier concentration, determined by this method, is inversely proportional to the area squared and the depth profiled is inversely proportional to area, large errors can occur. A 10% error in the contact area results in a 10% error in depth and more importantly a 20% error in the calculated carrier concentration. Although not all of the error can be corrected by measuring the final etch well area, routine measurement of this after each run significantly improves the repeatability of the measurement.

Gas bubbles and surface films can affect the measurement during profiling. Gas bubbles arise due to trapped air when the electrochemical cell is initially filled, or during electrolyte circulation or are a result of the electrochemical reactions used to etch the sample. Surface films arise from non-ideal electrochemical etching and are usually prevented by selecting a more appropriate electrolyte. Both gas bubbles and surface films lead to non-planer etching which changes the measurement area and can seriously affect measurement quality when multi-layer structures or structures with changing carrier concentration are being profiled. Gas bubbles can be removed by controlling the electrolyte flow and surface films can be prevented by careful control of the etching conditions. The etching bias, current and electrolyte flow rate are variables that can be controlled to alleviate these problems. Often the operator is not aware of the presence of gas bubbles or surface films and does not take action until their effect is seen in the electrical measurements, by which time the accuracy of the measurement is poor.

It is common practice to routinely check the sealing ring area by using an anodized n-type GaAs substrate, referred to as a 'blue film slice'. The 'blue film slice' is profiled to form a shallow etch well, typically less than 0.5 microns deep. The slice is then removed from the tool and the area of the etched well is determined using a measuring microscope or some form of camera based metrology system. It is not the purpose of this invention to eliminate the need for this measurement as it provides important addition information on the quality of the seal and can be made without removing the sample from the tool using the apparatus described herein.

Electrochemically etching occurs when the sample is the anode (biased positively with respect to a counter electrode). For p-type material this is the forward bias condition and electrochemical etching readily takes place. For n-type material this is the reverse bias condition and electrochemical etching only occurs when the sample is illuminated with light of energy above the band-gap of the material.

Seepage under the edge of the ring means that the illuminated area is smaller than the area of contact between the sample and the electrolyte. This difference is important as the capacitance measurement is made over the whole of the sample area in contact with the liquid. The 'blue film slice' is used to measure the difference in these two areas. This excess area, $A_{excess}$ increases as the seal wears and is defined as:

$$A_{excess} = A_{wetted} - A_{illum}$$

Where $A_{wetted}$ is the contact area between the electrolyte and the sample (wetted area) and $A_{illum}$ is the area illuminated by light, which for n-type material is the area profiled during the electrochemical etching process. The excess area is a small ring of material that lies under or close to the sealing ring edge. The capacitance associated with this ring of material gives rise to errors, especially for samples with a highly doped surface layer and lower doped interior, referred to as 'Hi-Lo' structures.

In addition to 'blue film slice' calibrations, some users measure the area of the etched well when the measurement is complete. The area of the sidewall is generally ignored, as the depth of the etched well is usually small in comparison with its diameter. Occasionally, the sample is also stylus profiled to check for roughness and to see that the etched well is planer. These measurements are made using other instruments such as a measuring microscope and a stylus profiler, which are not part of the ECV profiling tool. As a result these measurements are not always made and this leads to poor reproducibility. Further, without some means of viewing the sample surface during the measurement the conditions that lead to roughness and non-planer etching are difficult to avoid.

SUMMARY

One aspect of the invention can mitigate some or all of these disadvantages and so improve accuracy and reproducibility of ECV profile measurements.

Another aspect of the invention provides a method of ECV profiling which allows for viewing of the sample during electrolyte filling and ECV profiling and for viewing and measuring the etched well area, without the need to remove the sample from the apparatus.

It a particular aspect of the invention, a method of ECV profiling provides valuable information to the user to optimize the conditions, to alleviate problems with gas bubbles and surface films and to improve the accuracy and repeatability of the measurement.

Thus, in accordance with the invention in a first aspect, a method for improving the accuracy and repeatability of Electrochemical Capacitance Voltage (ECV) profiling comprises the steps of:

providing a sample, a means of defining a measurement region on the sample, an electrochemical cell to contain the electrolyte which is in contact with the sample, and ECV profiling in conventional manner;

monitoring the sample during the electrolyte fill cycle to observe, and optionally obtain measurements of, the presence of gas bubbles and surface films formed thereon;

monitoring the etched well during profiling;

measuring the etched well area at the end of the profile;

applying the said measurements to the raw profiling data to produce adjusted data more reproducibly representative of the ECV profile.

In accordance with the method a suitable optical system is used which can be combined with the ECV profiling apparatus to monitor the sample during fill, monitor the etched well during the measurement (ie profiling step) and accurately measure the well area once the measurement is complete, without removing the sample from the apparatus. This results in both improved accuracy and reproducibility and saves wasting time on measurements that may have been made under non-ideal conditions.

The step of monitoring the sample during the electrolyte fill cycle optionally comprises the step of obtaining a measurement of gas bubble formation thereon. This measurement may be used to provide automatic feedback for elimination of gas bubbles and/or to further adjust the raw profiling data to produce data more reproducibly representative of the ECV profile.

In a particular embodiment of the method, observation and measurement of the etched well comprises the use of a light source, preferably of energy above the band-gap of the sample, to illuminate the sample, and the use of image collection means to collect a reflected light image from the sample and image analysis means to analyse the reflected light image from the sample and obtain the said measurements from the etched well.

The image collection means preferably comprises digital imaging means and/or incorporates means to digitise the image for subsequent analysis by the image analyser. For example the imaging means comprises a CCD camera.

Preferably, the reflected light image is directed towards the imaging means by use of suitable directing means such as a beam splitter.

The light source has a dual purpose, providing light for etching n-type semiconductors and light for viewing the bottom of the etched well. A second light source of energy below the band-gap of the sample may be provided to illuminate the sample during electrical measurements.

In a preferred embodiment the same light source and imaging means are used to view and monitor the sample during the electrolyte fill cycle and the etched well area subsequently. In this embodiment the method comprises using the light source to generate a reflected light image of the sample during the electrolyte fill cycle and collecting the image via the imaging means, draining the electrochemical cell, taking the cell out of the optic path, using the light source to generate a reflected light image of the etched well area collecting the image via the imaging means to measure the said area.

In accordance with the invention in a second aspect, an apparatus for improving the accuracy and repeatability of Electrochemical Capacitance Voltage (ECV) profiling comprises means to monitor a sample during the electrolyte fill cycle to observe, and optionally further to obtain measurements of, the presence of gas bubbles and surface films formed thereon, means to monitor the etched well during profiling, means to obtain a measurement of the etched well area at the end of the profile, whereby the said measurements may applied to raw profiling data to produce adjusted data more reproducibly representative of the ECV profile.

Preferably, a suitable optical system is provided to obtain the said measurements. In particular, a single optical system is adapted for use in combination with the ECV profiling apparatus to both monitor the etched well during the measurement and accurately measure the well area once the measurement is complete, without removing the sample from the apparatus.

In a preferred embodiment, the means to monitor a sample during the electrolyte fill cycle, the means to monitor the etched well during profiling, and the means to obtain a measurement of the etched well comprises a single optical system, preferably including a light source, preferably of energy above the band-gap of the sample, to illuminate the sample, and image collection means to collect a reflected light image from the sample, and further preferably including image analysis means to analyse the reflected light image from the sample and obtain the said measurements.

Thus, in accordance with the invention in-situ apparatus is provided with a single optical system for monitoring gas bubbles and surface films during the etching process and for measuring the etched well area at the end of the measurement cycle comprising:

Conveniently, for materials with a band-gap less than 2.5 eV, the light source is a quartz halogen lamp. However it is within the scope of the invention to use other light sources, such as a UV discharge lamp for wider band-gap materials.

The image collection means preferably comprises digital imaging means and/or incorporates means to digitise the image for subsequent analysis by the image analyser. For example the imaging means comprises a CCD camera.

The analysing means conveniently comprise a suitable programmed computer. The imaging means is preferably interfaced to a computer to pass a digitized image thereto for processing the said measurements and/or applying the measurements to raw profiling data in the manner of the invention using suitable analysis software.

The data from the image is processed using software that can extract the etched well area and in the case of a suitable sample such as a 'blue film slice' is able to differentiate between the wetted and illuminated areas, measure them and determine the excess area.

Additionally or alternatively data from the image is processed using software to analyse the image and use the results of the analysis to provide automatic feedback for elimination of gas bubbles and surface films.

Additionally or alternatively the software may control variable magnification on the imaging means.

Preferably, the reflected light image is directed towards the imaging means by use of suitable directing means such as a beam splitter.

In a preferred embodiment the same light source and imaging means are used to view and monitor the sample during the electrolyte fill cycle and the etched well area subsequently. Conveniently, the apparatus further includes means to receive an electrochemical cell in the optical path of the imaging means during the electrolyte fill cycle, which are adapted to enable the cell to be removed from the optical path subsequently, so the same light source may be used to generate a reflected light image of the etched well area collecting the image via the imaging means to measure the said area.

A mechanism for removing the electrochemical cell from the optical path so that the camera can view the etched well and surrounding material without interference from the cell and any sealing ring etc is conveniently provided.

Focusing means may be provided to compensate for the difference in focal length when the cell windows and electrolyte are in the path. A variable focus camera or like imaging means may be provided. More simply, a fixed focus camera or like imaging means may be provided, and a removable lens in the light path to the imaging means may be provided to compensate for the difference in focal length. A mechanism may be provided for moving the sample along the optical axis so that it focuses on the fixed focus camera or like imaging means.

The electrochemical cell may be provided with a window for viewing and illuminating the sample, which is preferably slightly angled to prevent reflection from the surfaces of the window degrading the reflected image on the camera or other imaging means.

The apparatus may further comprise a flip lens before the camera or other imaging means to correct for refraction by the electrolyte and cell window when the apparatus is being used to view and/or monitor gas bubbles and surface films The apparatus is preferably interfaced to a suitable computer, and conveniently the computer controlling the ECV profiling measurement, so that the image of the etched well can be viewed in real time together with the electrical measurements.

BRIEF DESCRIPTION OF THE DRAWINGS

An embodiment of the invention will now be described, by way of example only, with reference to the following Figures wherein.

DETAILED DESCRIPTION

Figure 1:
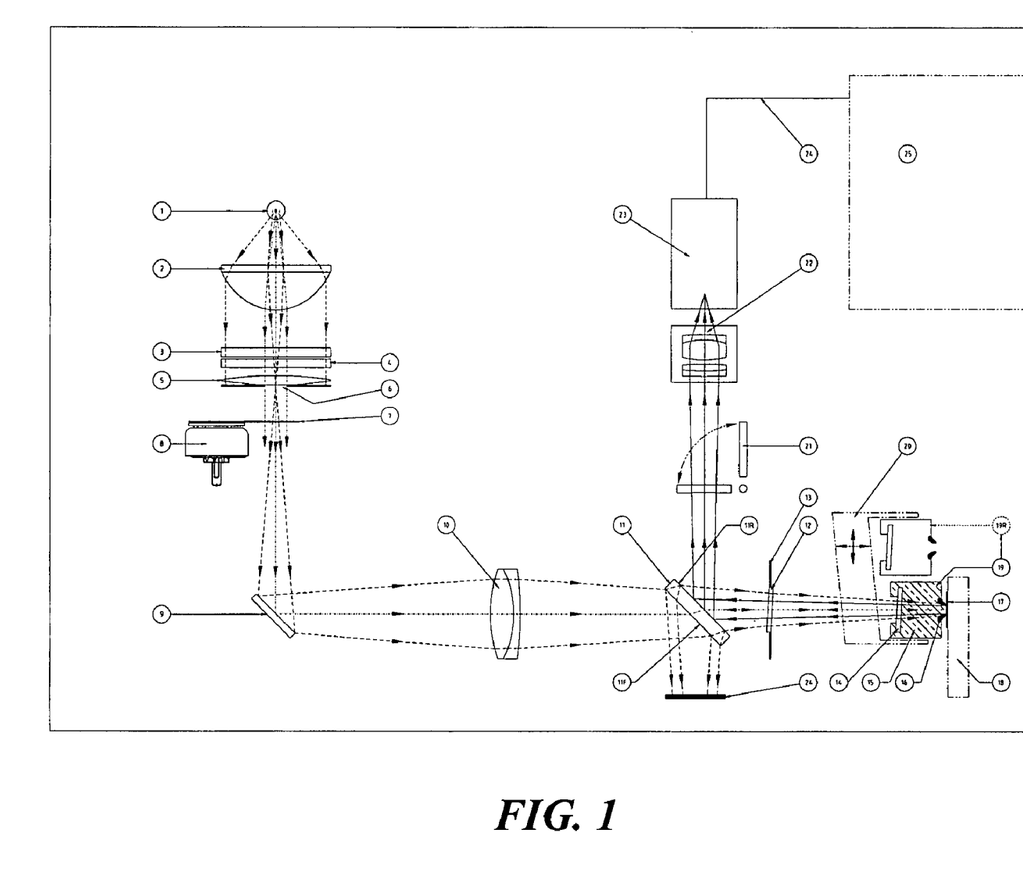
FIG. 1 is a diagrammatic illustration of an apparatus in accordance with the invention.

Referring to the figures and firstly to FIG. 1 there is shown a diagrammatic illustration of an apparatus in accordance with the invention.

The apparatus essentially comprises a camera viewing system which, towards the left hand side, comprises a light source [1-6], towards the left hand side, comprises the sample [17], sealing ring [16], electrochemical cell [19] and a means [20] of moving the ring and electrochemical cell out of the optical path, towards the top, comprises a camera [23] for viewing the sample and in the centre of the figure there are shown various optical components for directing light through the system.

In the embodiment shown in FIG. 1, a quartz halogen lamp [1] and optical filter [4] are used to provide the light of energy above the band-gap of the sample for etching the sample and for viewing the etched well.

The light from lamp [1] is collimated by the condenser [2] before passing through a heat filter [3] short-pass or band-pass filter [4] field lens [5] and aperture [6]. The light then passes a shutter [7], which is operated by a solenoid [8] in order to control the period of time the sample is etched for. A fold mirror [9] reflects the beam to an imaging lens [10], which re-images the aperture [6] at the sample position [17].

The beam from the imaging lens [10] passes through a beamsplitter [11] vapour barrier window [12] in the vapour barrier [13] cell rear window [14] electrolyte [15] to the sealing ring [16] abutting the sample [17] located by the sample holder [18]. The vapour barrier window [12] and cell rear window [14] are inclined at a slight angle to prevent reflections from their surfaces from entering the field of view of the camera [23].

Figure 2:
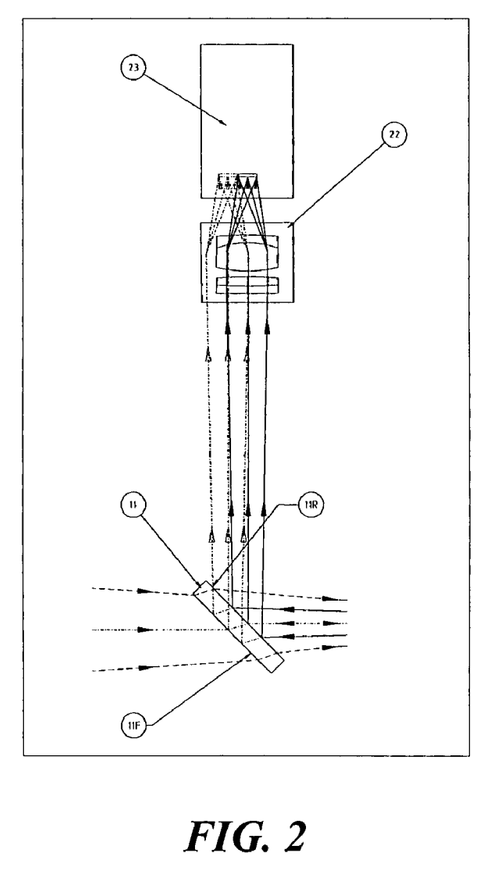
FIG. 2 is a more detailed diagram of the imaging apparatus of FIG. 1.

The etch process can be monitored by the camera [23] through the lens [22] and the supplementary lens [21] by means of reflection from the rear face of the beamsplitter [11R]. The beamsplitter [11] is made with sufficient thickness to prevent reflections from the interior of the front face [11F] entering the field of view of the camera; reflections from the exterior of the front face [11F] are absorbed by means of a non-reflective surface [24], see FIG. 2. The supplementary lens [21] compensates for the refractive index changes [in the light path] of the cell rear window [14] and electrolyte [15].

Figure 3:
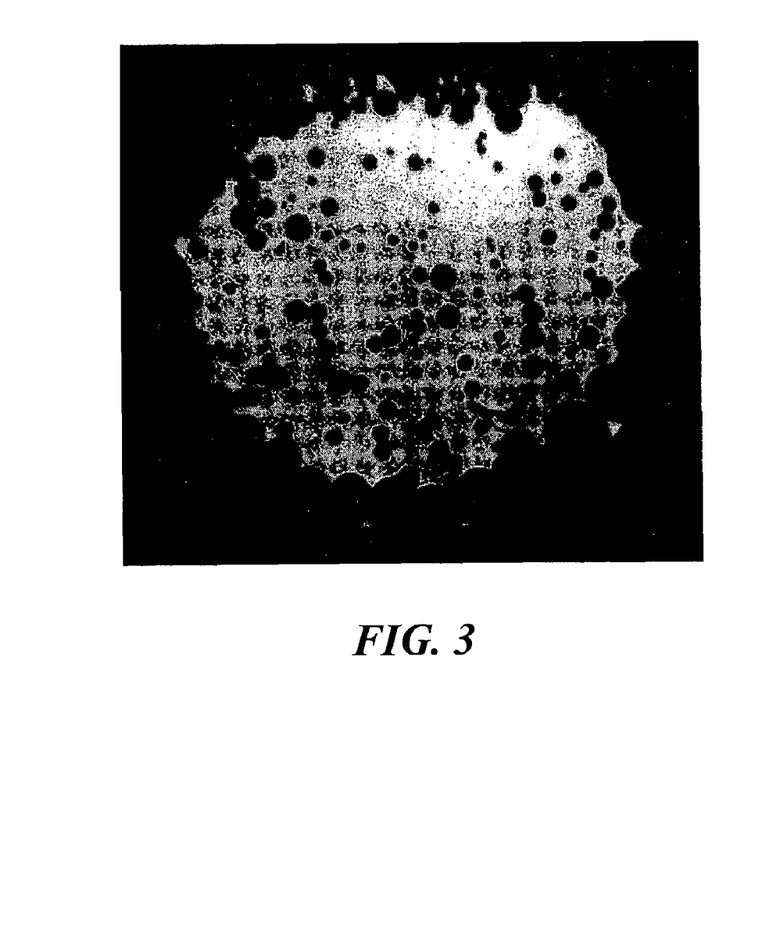
FIG. 3 is an illustration of an image showing gas bubble formation.

In the absence of gas bubbles or films a uniform light background is seen from the sample surrounded by the edge of the sealing ring. Gas bubbles, in the optical path, scatter the light entering the cell and are imaged as dark areas, FIG. 3. Bubbles at the surface of the sample are sharply in focus and can be clearly seen down to very small sizes, typically 50 microns. Surface films produce varying levels of contrast and disrupt the uniformity of the image and so are also readily observed.

In a preferred embodiment of the invention the image from the camera [23] is transferred to a computer [25] controlling the ECV profiling measurement by the cable [24] and the image of the etched well is viewed in real time as the sample is etched.

In yet a further preferred embodiment of the invention the image is analysed by software that uses the result of the analysis to provide automatic feedback for elimination of gas bubbles and surface films.

In a preferred embodiment of the invention as illustrated in the present example the etched area can be measured by the same camera [23] and lens [22] as used for earlier observations. To enable this the cell [19] is retracted by the mechanism [20], to a position clear of the sample [19R] and the supplementary lens [21] is pivoted out of the beam path. The magnification of the optics and the resolving power of the camera are such that the etched well area can be measured with sufficient resolution, typically better than 0.5%. Removing the supplementary lens [21] from the beam path gives a more stable optical configuration for accurate area determination. However, it is within the scope of the invention to reverse the role of the correction lens, although this would not be preferred.

Figure 4:
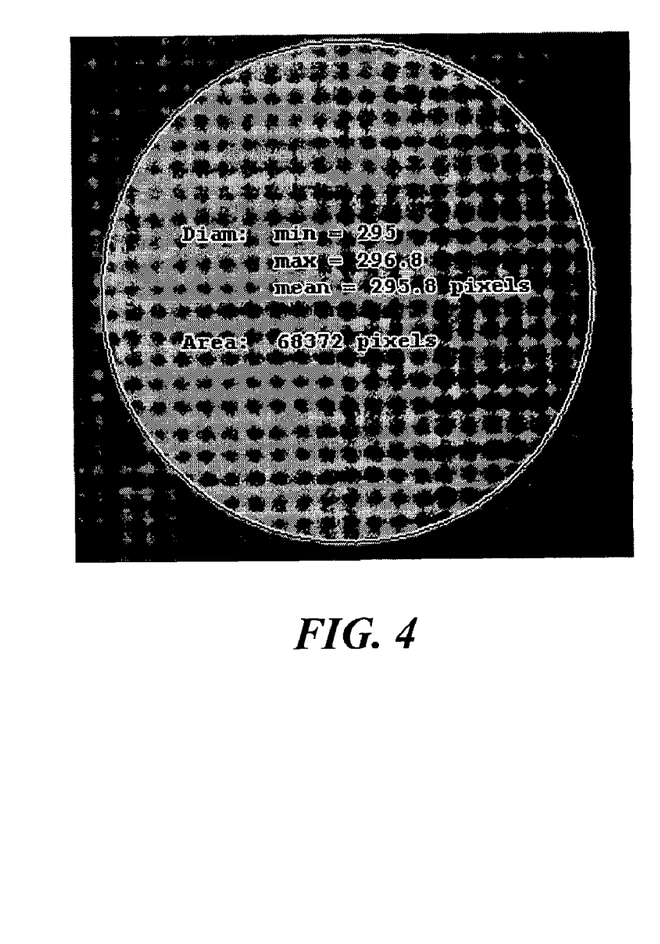
FIG. 4 is an illustration of an image suitable for etched well area measurement.

In a preferred embodiment of the invention as illustrated by the example the camera magnification is fixed and calibrated. The camera is interfaced to a computer [25] and the image digitized. The data from the image is processed using software that can extract the etched well area, FIG. 4 and in the case of a 'blue film slice' or other suitable sample is able to differentiate between the wetted and illuminated areas, measure them and determine the excess area.

In the alternative arrangement the camera magnification could be variable and controllable via the software.

In a further alternative arrangement the supplementary lens [21] could be dispensed with and the sample holder [18] and sample [17] are translated along the optical axis to bring the sample into focus on the camera.

Figure 5:
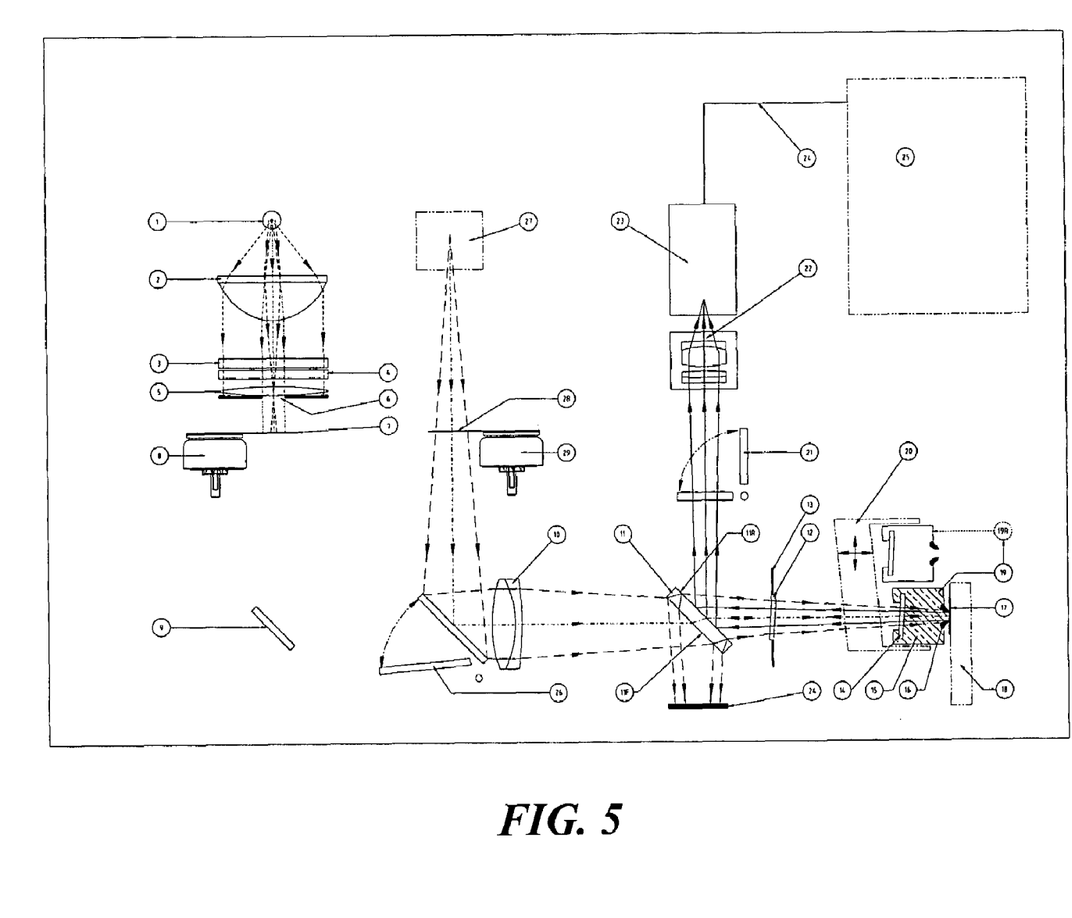
FIG. 5 is a diagrammatic illustration of an alternative embodiment of apparatus in accordance with the invention.

In a further embodiment, illustrated in FIG. 5, a pivoting mirror [26] is swung in front of the imaging lens [10]. This allows a secondary light source [27] to illuminate the sample [17]. The secondary light source can be used to illuminate the sample with light of energy less than the samples band-gap, so that the sample can be viewed during electrical measurements such as capacitance-voltage measurements. By making the light source variable in wavelength it can be used to perform other optical/electrical measurements such as reflection spectroscopy, photovoltage spectroscopy, photocurrent spectroscopy and modulated photovoltage spectroscopy.

By using light of energy less than the samples band-gap, samples containing a pn junction can be viewed during etching of the p-type layer without etching into the n-type layer where the conditions for the electrical measurements may be different.

Figure 6:
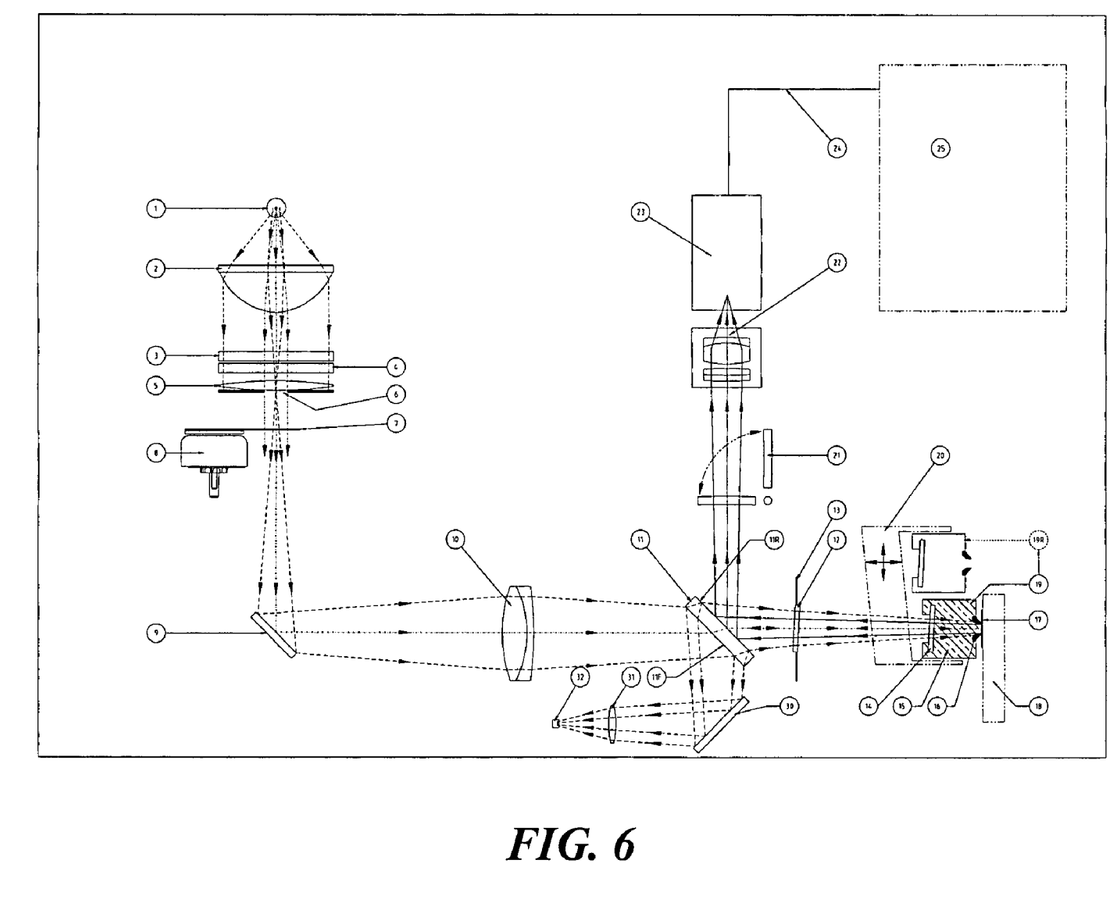
FIG. 6 is a diagrammatic illustration of an alternative embodiment of apparatus in accordance with the invention.

In yet a further embodiment, FIG. 6 a fold mirror [30] replaces the non-reflective surface [24]. This mirror reflects light from the beamsplitter [11] to a lens [31], which focuses the light on to a photo-detector [32] for the purpose of monitoring the light intensity.

The invention claimed is:

1. A method for improving the accuracy and repeatability of Electrochemical Capacitance Voltage (ECV) profiling comprising the steps of:
   providing a sample, a sealing ring for defining a measurement region on the sample, and providing an electrochemical cell to contain the electrolyte which is in contact with the sample during ECV profiling;
   monitoring the sample during an electrolyte fill cycle to observe the presence of gas bubbles formed on the sample;
   monitoring the etched well for gas bubbles or surface films formed on the sample during ECV profiling;
   measuring the area of the etched well at the end of the ECV profiling;
   applying the measurement of the area of the etched well to ECV profiling data to produce adjusted data more reproducibly representative of the ECV profile.

2. A method in accordance with claim 1 wherein a an optical system is used which can be combined with an ECV profiling apparatus for both monitoring the etched well during filling and ECV profiling and measuring the area of the etched well once the profiling is complete, without removing the sample from the ECV profiling apparatus.

3. A method in accordance with claim 1 wherein the steps of monitoring and measuring the area of the etched well comprise illuminating the sample with light above a band-gap energy of the sample and collecting a reflected light image from the sample and analyzing the reflected light image from the sample to obtain the measurement of the area of the etched well.

4. A method in accordance with claim 3 wherein collecting a reflected light comprises using a digital image collector and/or a digitizer to digitise the image for subsequent analyzing.

5. A method in accordance with claim 3 wherein the reflected light is directed to be collected by use of a beam splitter.

6. A method in accordance with one of claim 3 wherein the illuminating the sample and collected reflected light in the steps of monitoring and measuring the area of the etched well use a same light source and image collector, the method comprises using the light source to generate a reflected light image of the cell during the electrolyte fill cycle and collecting the image via the imaging collector, draining the electrochemical cell, taking the cell out of the optic path, using the light source to generate a reflected light image of the etched well area, and collecting the image via the imaging collector to measure the area of the etched well.

7. A method in accordance claim 1 wherein the step of monitoring the sample during the electrolyte fill cycle comprises the step of obtaining a measurement of gas bubble formation on the sample and using the measurement of gas bubble formation to provide automatic feedback for elimination of gas bubbles and/or to further adjust the ECV profiling data to produce data more reproducibly representative of the ECV profile.

* * * * *